United States Patent
Parthasarathy et al.

(10) Patent No.: US 6,734,524 B1
(45) Date of Patent: May 11, 2004

(54) ELECTRONIC COMPONENT AND METHOD OF MANUFACTURING SAME

(75) Inventors: Vijay Parthasarathy, Phoenix, AZ (US); Vishnu Khemka, Mesa, AZ (US); Ronghua Zhu, Chandler, AZ (US); Amitava Bose, Tempe, AZ (US); Todd Roggenbauer, Chandler, AZ (US); Paul Hui, Mesa, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/335,030

(22) Filed: Dec. 31, 2002

(51) Int. Cl.⁷ ............................................. H01L 29/00
(52) U.S. Cl. ................. 257/510; 257/374; 257/396; 257/397; 257/513; 257/520; 257/559; 257/647; 438/221; 438/296; 438/353; 438/207; 438/218; 438/219; 438/297
(58) Field of Search .................. 257/374, 396–398, 257/510–521, 559, 647, 648

(56) References Cited

U.S. PATENT DOCUMENTS

| | | | |
|---|---|---|---|
| 4,534,826 A | * | 8/1985 | Goth et al. .................. 438/421 |
| 4,785,337 A | * | 11/1988 | Kenney ........................ 257/304 |
| 4,789,885 A | * | 12/1988 | Brighton et al. ............. 257/588 |
| 4,980,757 A | * | 12/1990 | Nishigaki .................... 358/533 |
| 5,436,179 A | | 7/1995 | Erdeljac et al. |
| 5,811,315 A | | 9/1998 | Yindeepol et al. |
| 6,034,413 A | | 3/2000 | Hastings et al. |
| 6,110,797 A | | 8/2000 | Perry et al. |
| 6,265,741 B1 | | 7/2001 | Schrems |
| 6,365,447 B1 | | 4/2002 | Hebert et al. |
| 6,399,449 B1 | | 6/2002 | Matsumoto |
| 2002/0081809 A1 | | 6/2002 | Pinto et al. |

* cited by examiner

Primary Examiner—David Nelms
Assistant Examiner—Andy Huynh
(74) Attorney, Agent, or Firm—Bryan Cave LLP

(57) ABSTRACT

An electronic component includes a semiconductor substrate (110), an epitaxial semiconductor layer (120, 221, 222) over the semiconductor substrate, and a semiconductor region (130, 230) in the epitaxial semiconductor layer. The epitaxial semiconductor layer has an upper surface (123). A first portion (121) of the epitaxial semiconductor layer is located below the semiconductor region, and a second portion (122) of the epitaxial semiconductor layer is located above the semiconductor region. The semiconductor substrate and the first portion of the epitaxial semiconductor layer have a first conductivity type, and the semiconductor region has a second conductivity type. At least one electrically insulating trench (140, 240) extends from the upper surface of the epitaxial semiconductor layer into at least a portion of the semiconductor region. The semiconductor substrate has a doping concentration higher than a doping concentration of the first portion of the epitaxial semiconductor layer.

33 Claims, 3 Drawing Sheets

ELECTRONIC COMPONENT AND METHOD OF MANUFACTURING SAME

FIELD OF THE INVENTION

This invention relates generally to electronics, and relates more particularly to electronic components and methods of manufacture.

BACKGROUND OF THE INVENTION

The metal-oxide-semiconductor field-effect-transistor (MOSFET) is an electronic component that has long been used for a wide variety of applications. Power applications, such as printer head drivers, motor controls, anti-lock brake systems, and distributed airbag deployment systems, impose certain requirements on electronic components used in such applications. For example, MOSFETs used in power applications must have high breakdown voltages or, in other words, must be capable of tolerating the high currents and voltages characteristic of power applications without breaking down. High breakdown voltages in MOSFETs have been achieved, for example, by providing epitaxial layers with large thicknesses and low (doping concentration for sustaining the appropriate breakdown voltage. Proper power MOSFET functionality also depends on reducing or eliminating parasitic injection of minority carriers into the substrate when the MOSFET drain goes below the substrate potential. Parasitic substrate injection reduction has been achieved, for example, by heavily doping the substrate such that the minority carriers that cause such parasitic substrate injection have very short diffusion lengths. Thick epitaxial layers, however, tend to increase the minority carrier diffusion lengths, thus interfering with the ability of the heavily doped substrate to reduce parasitic substrate injection. Although silicon-on-insulator (SOI) platforms have proven effective in providing high breakdown voltages and in eliminating parasitic minority carrier substrate injection, the design complexity, higher wafer cost, and lower heat removal capability of SOI technology make the use of SOI platforms problematic for many applications. Accordingly, there exists a need for a non-SOI electronic component capable of providing the high breakdown voltages and low parasitic minority carrier substrate injection necessary for power applications.

BRIEF DESCRIPTION OF THE DRAWINGS

The invention will be better understood from a reading of the following detailed description, taken in conjunction with the accompanying figures in the drawings in which.

Figure 1:
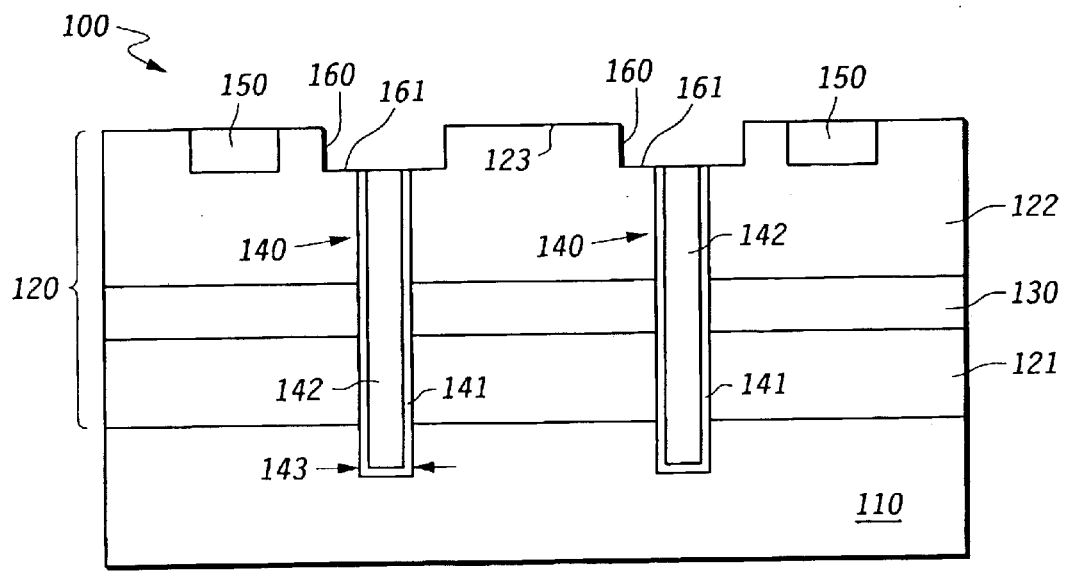
FIG. 1 is a cross sectional view of an electronic component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In an embodiment of the invention disclosed herein, an electronic component includes a semiconductor substrate, an epitaxial semiconductor layer over the semiconductor substrate, and a semiconductor region in the epitaxial semiconductor layer. The epitaxial semiconductor layer has an upper surface. A first portion of the epitaxial semiconductor layer is located below the semiconductor region, and a second portion of the epitaxial semiconductor layer is located above the semiconductor region. The semiconductor substrate and the first portion of the epitaxial semiconductor layer have a first conductivity type, and the semiconductor region has a second conductivity type. At least one electrically insulating trench extends from the upper surface of the epitaxial semiconductor layer into at least a portion of the semiconductor region. The semiconductor substrate has a doping concentration higher than a doping concentration of the first portion of the epitaxial semiconductor layer.

Referring now to FIG. 1, which is a cross sectional view of an electronic component according to an embodiment of the invention, an electronic component 100 comprises a semiconductor substrate 110, an epitaxial semiconductor layer 120 over semiconductor substrate 110, and a semiconductor region 130 in epitaxial semiconductor layer 120. In the embodiment illustrated in FIG. 1, epitaxial semiconductor layer 120 is a single epitaxial semiconductor layer comprising a portion 121 located below semiconductor region 130 and a portion 122 located above semiconductor region 130. As an example, portion 122 can have a thickness of approximately two to six micrometers, which can allow electronic component 100 to achieve breakdown voltages in excess of 55 volts (V). Epitaxial semiconductor layer 120 has an upper surface 123. In one embodiment, semiconductor substrate 110 and epitaxial semiconductor layer 120 can both comprise silicon. In a different embodiment, one or more of semiconductor substrate 110 and epitaxial semiconductor layer 120 can comprise different semiconductor materials.

Electronic component 100 further comprises an electrically insulating trench 160 in epitaxial semiconductor layer 120. Electrically insulating trench 160 has a bottom surface 161. Electronic component 100 still further comprises at least one electrically insulating trench 140, a top portion of which can be adjacent to bottom surface 161 of electrically insulating trench 160. In one embodiment, electrically insulating trench 140 extends from bottom surface 161 into at least a portion of semiconductor substrate 110. In another embodiment, Electrically insulating trench 140 could extend from bottom surface 161 into at least a portion of semiconductor region 130, but not into portion 121 of epitaxial semiconductor layer 120. In yet another embodiment, electrically insulating trench 140 could extend from bottom surface 161 into at least a portion of portion 121 of epitaxial semiconductor layer 120, but not into semiconductor substrate 110. In still another embodiment, electrically insulating trench 140 could extend from upper surface 123, and electronic component 100 could either include or not include electrically insulating trench 160. In a particular embodiment, electrically insulating trench 140 extends below bottom surface 161 a distance of approximately 8.0 micrometers when epitaxial semiconductor layer 120 has a thickness of approximately 10.0 micrometers.

Semiconductor substrate 110 and portion 121 of epitaxial semiconductor layer 120 have a first conductivity type, and semiconductor region 130 has a second conductivity type. In the same or a different embodiment, portion 122 of epitaxial semiconductor layer 120 has the first conductivity type. In one embodiment, the first conductivity type is a P-type conductivity, and the second conductivity type is an N-type conductivity. Semiconductor substrate 110 has a higher doping concentration than a doping concentration of portion 121. In a particular embodiment, the doping concentration of semiconductor substrate 110 is at least $10^{18}$ atoms per cubic centimeter.

Electronic component 100 may, in one embodiment, further comprise at least one dielectric material, such as a dielectric material 141, in electrically insulating trench 140. Dielectric material 141 may be an oxide or nitride layer, or may comprise some other dielectric material. As an example, the oxide layer can consist substantially of silicon dioxide that is thermally grown in an oxidation furnace or that is deposited by a chemical vapor deposition process. As other examples, the oxide layer can consist substantially of tetra-ethyl-ortho-silicate (TEOS) or phosphosilicate glass that is deposited by a chemical vapor deposition process, or an oxide layer can consist substantially of silicon oxy-nitride that is also deposited by a chemical vapor deposition process. Furthermore, the oxide layer can comprise a high dielectric constant material such as, for example, hafnium oxide. A nitride layer, as an example, can consist substantially of silicon nitride that is deposited by a chemical vapor deposition process. As another example, a nitride layer can consist substantially of silicon oxy-nitride that is also deposited by a chemical vapor deposition process.

In the embodiment illustrated in FIG. 1, dielectric material 141 lines but does not fill electrically insulating trench 140. In another embodiment, not shown, dielectric material 141 may fill electrically insulating trench 140. Electronic component 100 may further comprise a semiconducting material 142 in electrically insulating trench 140. Semiconducting material 142 may be separated from epitaxial semiconductor layer 120 by dielectric material 141. Further, semiconducting material 142 may be electrically floating or electrically biased, depending on the application for which electronic component 100 is designed. Semiconducting material 142 can be comprised of the same or a different semiconducting material as semiconductor substrate 110 and/or epitaxial semiconductor layer 120. In a particular embodiment, semiconducting material 142 comprises silicon.

Electronic component 100 may further comprise semiconductor devices 150 in epitaxial semiconductor layer 120. Adjacent ones of semiconductor devices 150 may be separated by one or more of electrically insulating trench 140. In a particular embodiment, as illustrated in FIG. 1, adjacent ones of semiconductor devices 150 are separated by two electrically insulating trenches 140. The two electrically insulating trenches are spaced apart from each other, with portions of semiconductor substrate 110, epitaxial semiconductor layer 120, and semiconductor region 130 located between the two electrically insulating trenches 140. It will be understood that the depth of electrically insulating trenches 140 below upper surface 123 or bottom surface 161 will determine what is located between electrically insulating trenches 140. For example, in an embodiment wherein electrically insulating trenches 140 extend from bottom surface 161 and into semiconductor region 130 but not into semiconductor substrate 110, it will be understood that portions of semiconductor region 130 and epitaxial semiconductor layer 120, but not semiconductor substrate 110, are located between the two electrically insulating trenches 140.

A width 143 of each electrically insulating trench 140 may vary depending on, among other factors, the number of electrically insulating trenches included in electronic component 100, and on the degree of electrical isolation desired between semiconductor devices 150. In one embodiment where only a single one of electrically insulating trench 140 is located between two adjacent semiconductor devices 150, width 143 is approximately 1.5 to 2.5 micrometers. In another embodiment where more than one electrically insulating trench 140 is located between two adjacent semiconductor devices 150, width 143 is approximately 1.0 to 2.0 micrometers. In the same or a different embodiment, both dielectric material 141 and semiconducting material 142 may have an as-deposited thickness of approximately 0.5 micrometers. In another embodiment, dielectric material 141 and semiconducting material 142 may have thicknesses that are different from each other, and from the values given hereinabove. Similarly, in an embodiment wherein electronic component 100 comprises more than one electrically insulating trench 140, different ones of the electrically insulating trenches may or may not have the same width 143.

Figure 2:
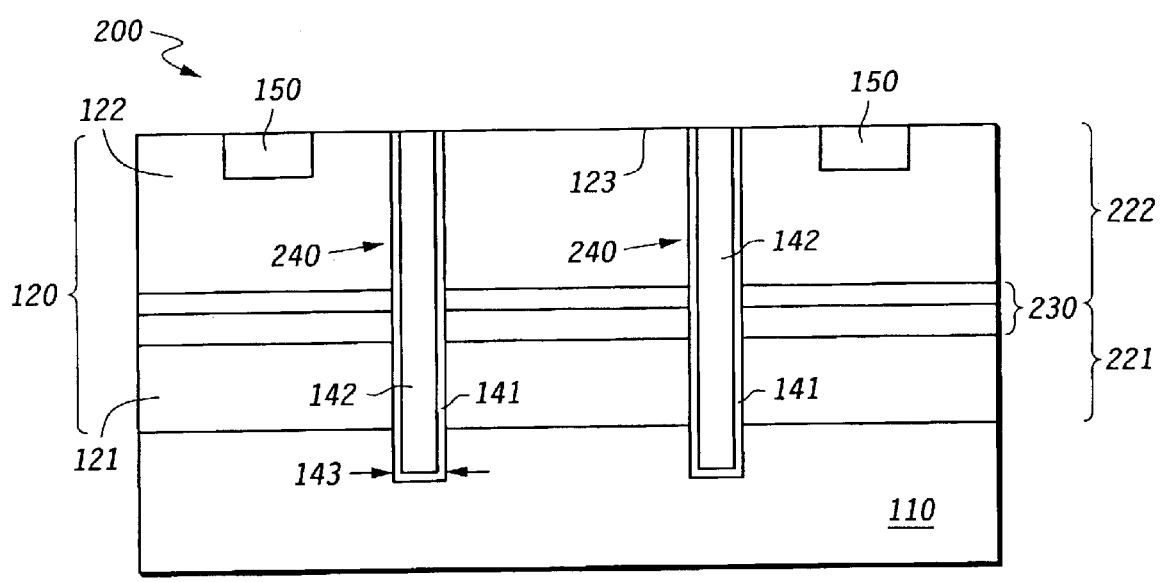
FIG. 2 is a cross sectional view of an electronic component according to another embodiment of the invention.

Referring now to FIG. 2, which is a cross sectional view of an electronic component according to another embodiment of the invention, an electronic component 200 comprises semiconductor substrate 110 and epitaxial semiconductor layer 120 over semiconductor substrate 110. Epitaxial semiconductor layer 120 is a composite epitaxial semiconductor layer comprised of an epitaxial semiconductor layer 221 and an epitaxial semiconductor layer 222 over epitaxial semiconductor layer 221. Portion 121 of epilaxial semiconductor layer 120 is located within epitaxial semiconductor layer 221, and portion 122 of epitaxial semiconductor layer 120 is located within epitaxial semiconductor layer 222. Prior to the formation of semiconductor region 230, epitaxial semiconductor layer 221 has the first conductivity type. In one embodiment, prior to the formation of semiconductor region 230, epitaxial semiconductor layer 222 also has the first conductivity type. In another embodiment, prior to the formation of semiconductor region 230, epitaxial semiconductor layer 222 has the second conductivity type. Semiconductor substrate 110 has a higher doping concentration than a doping concentration of epitaxial semiconductor layer 221. Semiconductor substrate 110 and epitaxial semiconductor layers 221 and 222 can be comprised of the same or different semiconducting materials.

Electronic component 200 further comprises a subsequently formed semiconductor region 230 located in epitaxial semiconductor layer 221 and in epitaxial semiconductor layer 222. Semiconductor layer 230 can be similar to semiconductor layer 130, but can be formed in a diffusion process rather than an implantation process. Semiconductor region 230 has the second conductivity type. Electronic component 200 still further comprises semiconductor devices 150 and at least one electrically insulating trench 240 extending from upper surface 123 into at least a portion of semiconductor substrate 110. In another embodiment, electrically insulating trench 240 could extend from upper surface 123 into at least a portion of semiconductor region 230, but not into portion 121. In yet another embodiment, electrically insulating trench 240 could extend from upper surface 123 into epitaxial semiconductor layer 221, but not into semiconductor substrate 110. In still another embodiment, electronic component 200 could comprise another electrically insulating trench similar to electrically insulating trench 160 in FIG. 1.

Figure 3:
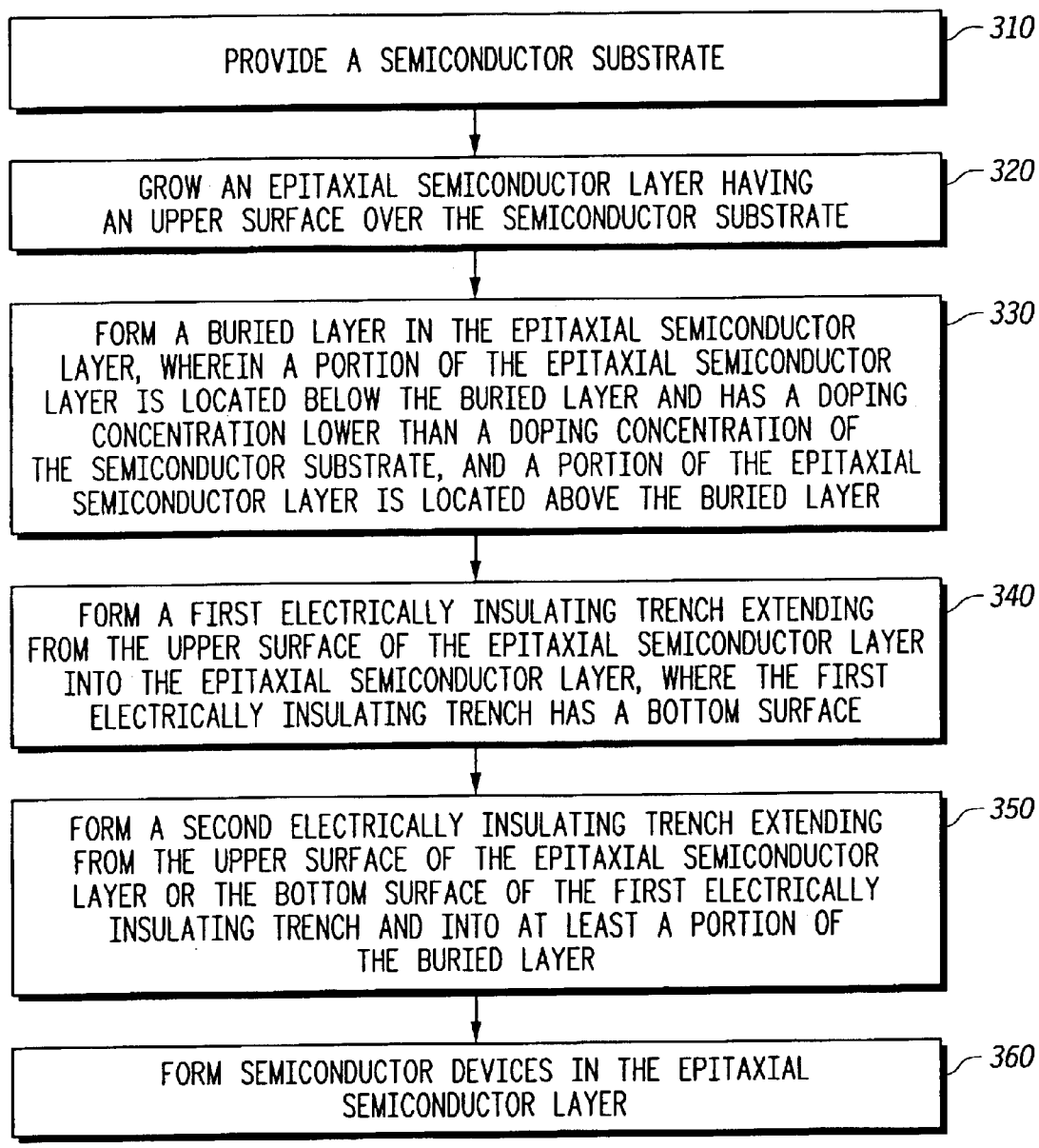
FIG. 3 is a flow chart illustrating a method of manufacturing an electronic component according to an embodiment of the invention.

Refer now to FIG. 3, which is a flow chart illustrating a method 300 of manufacturing an electronic component according to an embodiment of the invention. A step 310 of method 300 is to provide a semiconductor substrate. As an example, the semiconductor substrate can be similar to semiconductor substrate 110 in FIGS. 1 and 2. A step 320 of method 300 is to grow an epitaxial semiconductor layer having an upper surface over the semiconductor substrate. As an example, the epitaxial semiconductor layer can be similar to epitaxial semiconductor layer 120 in FIGS. 1 and 2. A step 330 of method 300 is to form a buried layer in the epitaxial semiconductor layer, wherein a portion of the epitaxial semiconductor layer is located below the buried layer and has a doping concentration lower than a doping concentration of the semiconductor substrate, and a portion of the epitaxial semiconductor layer is located above the buried layer. As an example, the buried layer can be similar to semiconductor region 130 in FIG. 1. In one embodiment, the buried layer is formed by ion implantation.

Referring still to FIG. 3, an optional step 340 of method 300 is to form a first electrically insulating trench extending from the upper surface of the epitaxial semiconductor layer into the epitaxial semiconductor layer, where the first electrically insulating trench has a bottom surface. As an example, the first electrically insulating trench can be similar to electrically insulating trench 160 in FIG. 1. A step 350 of method 300 is to form a second electrically insulating trench extending from the upper surface of the epitaxial semiconductor layer or the bottom surface of the first electrically insulating trench and into at least a portion of the buried layer. As an example, the second electrically insulating trench can be similar to electrically insulating trench 140 in FIG. 1 and electrically insulating trench 240 in FIG. 2. In one embodiment, step 350 of method 300 comprises forming one or more additional electrically insulating trenches similar to the second electrically insulating trench, wherein the additional electrically insulating trenches and the second electrically insulating trench are each separated from each other by portions of the first and second portions of the epitaxial semiconductor layer. A step 360 of method 300 is to form semiconductor devices in the epitaxial semiconductor layer, where adjacent semiconductor devices are separated by at least one of the second electrically insulating trenches. As an example, the semiconductor devices can be similar to semiconductor devices 150 in FIGS. 1 and 2.

Figure 4:
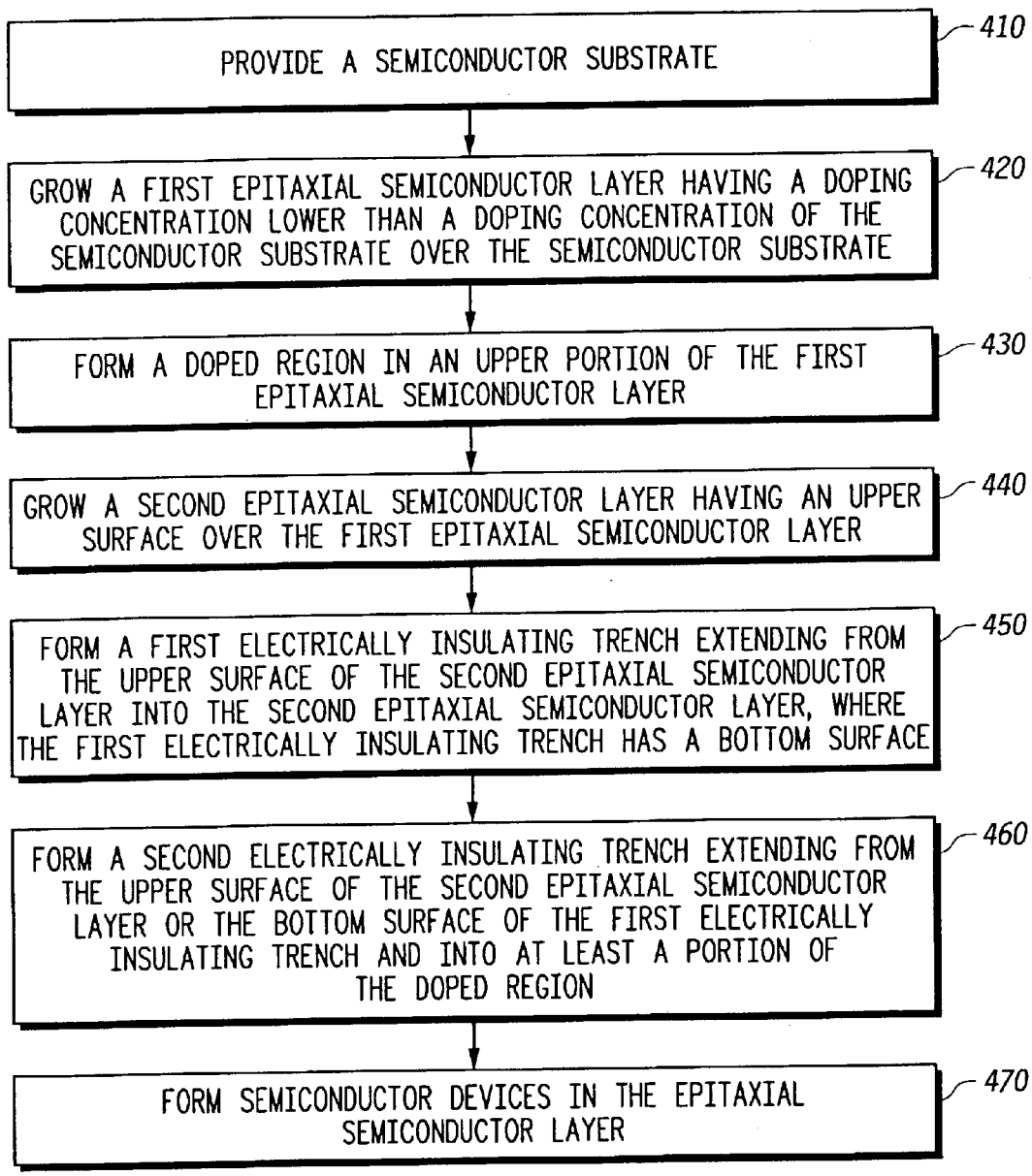
FIG. 4 is a flow chart illustrating a method of manufacturing an electronic component according to another embodiment of the invention.

Refer now to FIG. 4, which is a flow chart illustrating a method 400 of manufacturing an electronic component according to another embodiment of the invention. A step 410 of method 400 is to provide a semiconductor substrate. As an example, the semiconductor substrate can be similar to semiconductor substrate 110 in FIGS. 1 and 2. A step 420 of method 400 is to grow a first epitaxial semiconductor layer having a doping concentration lower than a doping concentration of the semiconductor substrate over the semiconductor substrate. As an example, the first epitaxial semiconductor layer can be similar to epitaxial semiconductor layer 221 in FIG. 2. A step 430 of method 400 is to form a doped region in an upper portion of the first epitaxial semiconductor layer. As an example, the doped region can be similar to semiconductor region 230 in FIG. 2.

Referring still to FIG. 4, a step 440 of method 400 is to grow a second epitaxial semiconductor layer having an upper surface over the first epitaxial semiconductor layer. As an example, the second epitaxial semiconductor layer can be similar to epitaxial semiconductor layer 222 in FIG. 2. In one embodiment, step 440 further comprises diffusing a portion of the doped region into a lower portion of the second epitaxial semiconductor layer. An optional step 450 of method 400 is to form a first electrically insulating trench extending from the upper surface of the second epitaxial semiconductor layer into the second epitaxial semiconductor layer, where the first electrically insulating trench has a bottom surface. As an example, the first electrically insulating trench can be similar to electrically insulating trench 160 in FIG. 1. A step 460 of method 400 is to form a second electrically insulating trench extending from the upper surface of the second epitaxial semiconductor layer or the bottom surface of the first electrically insulating trench and into at least a portion of the doped region. As an example, the second electrically insulating trench can be similar to electrically insulating trench 140 in FIG. 1 and electrically insulating trench 240 in FIG. 2. In one embodiment, step 460 of method 400 comprises forming one or more additional electrically insulating trenches similar to the second electrically insulating trench, wherein the additional electrically insulating trenches and the second electrically insulating trench are each separated from each other by portions of the first and second portions of the epitaxial semiconductor layer. A step 470 of method 400 is to form semiconductor devices in the second epitaxial semiconductor layer, where adjacent semiconductor devices are separated by at least one of the second electrically insulating trenches. As an example, the semiconductor devices can be similar to semiconductor devices 150 in FIGS. 1 and 2.

Although the invention has been described with reference to specific embodiments, it will be understood by those skilled in the art to which the invention pertains that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. To one of ordinary skill in the art it will be readily apparent that the invention discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. An electronic component comprising:
   a semiconductor substrate having a first conductivity type;
   an epitaxial semiconductor layer over the semiconductor substrate;
   a semiconductor region in the epitaxial semiconductor layer and having a second conductivity type, a first portion of the epitaxial semiconductor layer located below the semiconductor region and a second portion of the epitaxial semiconductor layer located above the semiconductor region, the first portion of the epitaxial semiconductor layer having the first conductivity type; and
   an electrically insulating trench extending into at least a portion of the semiconductor region,
   wherein:
   the first portion of the epitaxial semiconductor layer has a doping concentration lower than a doping concentration of the semiconductor substrate.

2. The electronic component of claim 1 wherein:
   the electrically insulating trench extends into at least a portion of the first portion of the epitaxial semiconductor layer.

3. The electronic component of claim 1 wherein:
   the electrically insulating trench extends into at least a portion of the semiconductor substrate.

4. The electronic component of claim 1 further comprising:
   at least one dielectric material filling the electrically insulating trench.

5. The electronic component of claim 1 further comprising:
   a dielectric material in the electrically insulating trench; and
   a semiconducting material in the electrically insulating trench and separated from the epitaxial semiconductor layer by the dielectric material.

6. The electronic component of claim 5 wherein:
   the semiconducting material is electrically floating.

7. The electronic component of claim 5 wherein:
   the semiconducting material is electrically biased.

8. The electronic component of claim 1 wherein:
   the doping concentration of the semiconductor substrate is at least $10^{18}$ atoms per cubic centimeter.

9. The electronic component of claim 1 wherein:
   the electrically insulating trench has a width of approximately 1.5 to 2.5 micrometers.

10. The electronic component of claim 1 wherein:
    the electrically insulating trench has a width of approximately 1.0 to 2.0 micrometers.

11. The electronic component of claim 1 wherein:
    the epitaxial semiconductor layer is a composite epitaxial semiconductor layer comprised of a first epitaxial semiconductor layer and a second epitaxial semiconductor layer, the first portion of the epitaxial semiconductor layer located within the first epitaxial semiconductor layer and the second portion of the epitaxial semiconductor layer located within the second epitaxial semiconductor layer;
    the first epitaxial semiconductor layer has the first conductivity type; and
    the second epitaxial semiconductor layer has the first conductivity type.

12. The electronic component of claim 1 wherein:
    the epitaxial semiconductor layer is a composite epitaxial semiconductor layer comprised of a first epitaxial semiconductor layer and a second epitaxial semiconductor layer, the first portion of the epitaxial semiconductor layer located within the first epitaxial semiconductor layer and the second portion of the epitaxial semiconductor layer located within the second epitaxial semiconductor layer;
    the first epitaxial semiconductor layer has the first conductivity type; and
    the second epitaxial semiconductor layer has the second conductivity type.

13. The electronic component of claim 1 wherein:
    the epitaxial semiconductor layer is a single epitaxial semiconductor layer; and
    the second portion of the epitaxial semiconductor layer has the first conductivity type.

14. The electronic component of claim 1 further comprising:
    a second trench in the epitaxial semiconductor layer, the second trench having a bottom surface,
    wherein:
    a portion of the electrically insulating trench is adjacent to the bottom surface of the second trench.

15. An electronic component comprising:
    a semiconductor substrate having a P-type conductivity;
    an epitaxial semiconductor layer over the semiconductor substrate;
    a semiconductor region in the epitaxial semiconductor layer having an N-type conductivity, a first portion of the epitaxial semiconductor layer located below the semiconductor region and a second portion of the epitaxial semiconductor layer located above the semiconductor region, the first portion of the epitaxial semiconductor layer having the P-type conductivity;
    a first electrically insulating trench extending through the second portion of the epitaxial semiconductor layer, through the semiconductor region, through the first portion of the epitaxial semiconductor layer, and into at least a portion of the semiconductor substrate; and
    two semiconductor devices in at least the second portion of the epitaxial semiconductor layer,
    wherein:
    a first one of the two semiconductor devices is separated from a second one of the two semiconductor devices by the first electrically insulating trench; and
    the first portion of the epitaxial semiconductor layer has a doping concentration lower than a doping concentration of the semiconductor substrate.

16. The electronic component of claim 15 wherein:
the first electrically insulating trench has a width of approximately 1.5 to 2.5 micrometers.

17. The electronic component of claim 15 further comprising:
a second electrically insulating trench extending through the second portion of the epitaxial semiconductor layer, through the semiconductor region, through the first portion of the epitaxial semiconductor layer, and into at least a portion of the semiconductor substrate,
wherein:
the first one of the two semiconductor devices is separated from the second one of the two semiconductor devices by the first and second electrically insulating trenches.

18. The electronic component of claim 17 wherein:
the first and second electrically insulating trenches are spaced apart from each other.

19. The electronic component of claim 18 wherein:
the first and second electrically insulating trenches have a width of approximately 1.0 to 2.0 micrometers.

20. The electronic component of claim 17 further comprising:
at least one dielectric material filling the first and second electrically insulating trenches.

21. The electronic component of claim 17 further comprising:
a dielectric material in the first and second electrically insulating trenches; and
a semiconducting material in the first and second electrically insulating trenches and separated from the epitaxial semiconductor layer by the dielectric material.

22. The electronic component of claim 21 wherein:
the semiconducting material is electrically floating.

23. The electronic component of claim 21 wherein:
the semiconducting material is electrically biased.

24. The electronic component of claim 21 wherein:
the doping concentration of the semiconductor substrate is at least $10^{18}$ atoms per cubic centimeter.

25. The electronic component of claim 21 wherein:
the epitaxial semiconductor layer is a composite epitaxial semiconductor layer comprised of a first epitaxial semiconductor layer and a second epitaxial semiconductor layer, the first portion of the epitaxial semiconductor layer located within the first epitaxial semiconductor layer and the second portion of the epitaxial semiconductor layer located within the second epitaxial semiconductor layer;
the first epitaxial semiconductor layer has the P-type conductivity; and
the second epitaxial semiconductor layer has the P-type conductivity.

26. The electronic component of claim 21 wherein:
the epitaxial semiconductor layer is a composite epitaxial semiconductor layer comprised of a first epitaxial semiconductor layer and a second epitaxial semiconductor layer, the first portion of the epitaxial semiconductor layer located within the first epitaxial semiconductor layer and the second portion of the epitaxial semiconductor layer located within the second epitaxial semiconductor layer;
the first epitaxial semiconductor layer has the P-type conductivity; and
the second epitaxial semiconductor layer has the N-type conductivity.

27. The electronic component of claim 21 wherein:
the epitaxial semiconductor layer is a single epitaxial semiconductor layer wherein the second portion of the epitaxial semiconductor layer has the P-type conductivity.

28. The electronic component of claim 15 further comprising:
a second trench in the epitaxial semiconductor layer, the second trench having a bottom surface,
wherein:
a portion of the first electrically insulating trench is adjacent to the bottom surface of the second trench.

29. A method of manufacturing an electronic component, the method comprising:
providing a semiconductor substrate;
growing an epitaxial semiconductor layer over the semiconductor substrate;
forming a buried layer in the epitaxial semiconductor layer, a first portion of the epitaxial semiconductor layer located below the buried layer and a second portion of the epitaxial semiconductor layer located above the buried layer; and
forming an electrically insulating trench extending into at least a portion of the buried layer,
wherein:
the epitaxial semiconductor layer has a doping concentration lower than a doping concentration of the first portion of the semiconductor substrate.

30. The method of claim 29 wherein:
forming an electrically insulating trench comprises:
forming a first electrically insulating trench; and
forming a second electrically insulating trench; and
the first electrically insulating trench and the second electrically insulating trench are separated by portions of the first and second portions of the epitaxial semiconductor layer.

31. A method of manufacturing an electronic component, the method comprising:
providing a semiconductor substrate;
growing a first epitaxial semiconductor layer over the semiconductor substrate;
forming a doped region in an upper portion of the first epitaxial semiconductor layer;
growing a second epitaxial semiconductor layer over the first epitaxial semiconductor layer;
forming an electrically insulating trench extending into at least a portion of the doped region,
wherein:
the first epitaxial semiconductor layer has a doping concentration lower than a doping concentration of the semiconductor substrate.

32. The method of claim 31 wherein:
growing the second epitaxial semiconductor layer further comprises:
diffusing a portion of the doped region into a lower portion of the second epitaxial semiconductor layer.

33. The method of claim 31 wherein:
forming an electrically insulating trench comprises:
forming a first electrically insulating trench; and
forming a second electrically insulating trench; and
the first electrically insulating trench and the second electrically insulating trench are separated by portions of the first and second epitaxial semiconductor layers.

* * * * *